United States Patent
Cho

(10) Patent No.: US 11,735,452 B2
(45) Date of Patent: Aug. 22, 2023

(54) OVERHEAD HOIST TRANSPORT SYSTEM

(71) Applicant: SK hynix Inc., Gyeonggi-do (KR)

(72) Inventor: Jun Kyu Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 82 days.

(21) Appl. No.: 17/492,947

(22) Filed: Oct. 4, 2021

(65) Prior Publication Data

US 2022/0108906 A1 Apr. 7, 2022

(30) Foreign Application Priority Data

Oct. 5, 2020 (KR) ........................ 10-2020-0127851

(51) Int. Cl.
*H01L 21/677* (2006.01)
*B23Q 3/154* (2006.01)

(52) U.S. Cl.
CPC ...... *H01L 21/67733* (2013.01); *B23Q 3/1546* (2013.01)

(58) Field of Classification Search
CPC ........ H01L 21/67733; H01L 21/67709; B23Q 3/1546; B66C 1/06
See application file for complete search history.

(56) References Cited

U.S. PATENT DOCUMENTS

| | | | | |
|---|---|---|---|---|
| 3,258,658 A | * | 6/1966 | Vaugn ................. | B23Q 3/1546 335/295 |
| 5,989,103 A | * | 11/1999 | Birang ................. | B23Q 3/1546 451/364 |
| 6,238,283 B1 | * | 5/2001 | Matsuyama ........ | H01L 21/6732 454/187 |
| 2008/0193270 A1 | * | 8/2008 | Yoshida .................. | B65G 37/02 414/731 |
| 2011/0031091 A1 | * | 2/2011 | Fatula, Jr. ......... | H01L 21/67769 198/463.3 |
| 2011/0262004 A1 | * | 10/2011 | Murakami .............. | B66C 13/48 382/103 |

(Continued)

FOREIGN PATENT DOCUMENTS

| | | |
|---|---|---|
| KR | 1020190109116 A | 9/2019 |
| KR | 1020190129190 A | 11/2019 |

(Continued)

*Primary Examiner* — Glenn F Myers
(74) *Attorney, Agent, or Firm* — IP & T Group LLP

(57) ABSTRACT

An overhead hoist transport system includes a vehicle, a wafer box and a controller. The vehicle includes a combiner. The combiner includes at least one magnetic module. The magnetic module is fixed to a base plate. The magnetic module is downwardly protruded. The wafer box includes a header. The header includes a combining member configured to correspond to the magnetic module. The controller is configured to generate a control signal for controlling attachment and detachment operations between the combiner and the wafer box. The magnetic module includes a frame, a first permanent magnet, a second permanent magnet and a magnetic switch. The frame has an annular cross-sectional shape. The first permanent magnet is fixed to the frame. The second permanent magnet is rotatably arranged in the frame. The magnetic switch is configured to rotate the second magnet in response to the control signal.

20 Claims, 12 Drawing Sheets

(56) References Cited

U.S. PATENT DOCUMENTS

| | | | |
|---|---|---|---|
| 2013/0216336 A1* | 8/2013 | Lee | H01L 21/67733 |
| | | | 414/225.01 |
| 2016/0005519 A1* | 1/2016 | Choi | H01F 7/064 |
| | | | 335/290 |
| 2020/0185137 A1* | 6/2020 | Morton | H01F 7/04 |

FOREIGN PATENT DOCUMENTS

| KR | 102172064 B1 | 10/2020 |
|---|---|---|
| KR | 10-2022-0045309 A | 4/2022 |

* cited by examiner

OVERHEAD HOIST TRANSPORT SYSTEM

CROSS-REFERENCES TO RELATED APPLICATION

The present application claims priority under 35 U.S.C. § 119(a) to Korean application number 10-2020-0127851, filed on Oct. 5, 2020, which is incorporated herein by reference in its entirety.

BACKGROUND

1. Technical Field

Various embodiments may generally relate to a physical distribution transport system and, more particularly, to an overhead hoist transport system configured to transport a wafer box between semiconductor fabrication apparatuses.

2. Related Art

A plurality of semiconductor fabrication apparatuses for fabricating semiconductor devices may be serially arranged in a clean room to perform various processes on a wafer. The wafer may be received in a wafer box. The wafer box may be transported to each of the semiconductor fabrication apparatuses. The wafer box may be returned from the semiconductor fabrication apparatuses. The wafer box may be referred to as a FOUP which is an acronym for Front Opening Unified Pod or Front Opening Universal Pod.

The wafer box may be transported by an overhead hoist transport (OHT) system installed at a ceiling of the clean room in which the semiconductor fabrication apparatuses may be serially arranged. The OHT system may include a rail installed on the ceiling of the clean room and a vehicle which moves along the rail. The wafer box may be loaded into the vehicle. The vehicle may include a runner which moves along the rail and a transporter fixed to the runner. The wafer box may be detachably fixed to the transporter.

According to related arts, the OHT system may include a plurality of mechanical mechanisms configured to detachably fix the wafer box to the vehicle. However, vibrations and impacts may be generated in attaching/detaching the wafer box to/from the vehicle using the mechanical mechanisms which may decrease the yield of the semiconductor device. Further, the mechanical mechanisms may bring about various problems such as a high initial installment cost, a high maintenance and repair cost, a curtailment limit of the physical attachment/detachment, a falling of the wafer box caused by a wear and disorder of the mechanical mechanisms, etc, Therefore, a new way for attaching/detaching the wafer box to/from the vehicle of an overhead hoist transport system for semiconductor wafer box is needed.

SUMMARY

Example embodiments of the present invention provide an improved overhead hoist transport system that may prevent problems caused during attaching and detaching of a wafer box to and from a vehicle of the overhead hoist transport system. The inventive system employs primarily magnetic energy for performing the attaching and detaching of the wafer box to the vehicle. This is to be contrasted with conventional systems using primarily mechanical means.

In example embodiments of the present disclosure, an overhead hoist transport system may include a vehicle, a wafer box and a controller. The vehicle may include a combiner. The combiner may include at least one magnetic module. The magnetic module may be fixed to a base plate. The magnetic module may be downwardly protruded. The wafer box may include a header. The header may include a combining member configured to correspond to the magnetic module. The controller may be configured to generate a control signal for controlling attachment and detachment operations between the combiner and the wafer box. The magnetic module may include a frame, a first permanent magnet, a second permanent magnet, and a magnetic switch. The frame may have an annular cross-sectional shape. The first permanent magnet may be fixed to the frame. The second permanent magnet may be rotatably arranged in the frame. The magnetic switch may be configured to rotate the second magnet in response to the control signal.

According to example embodiments, the wafer box may be attached/detached to/from the vehicle using the magnetic energy without mechanical mechanisms to prevent vibrations and impacts from being generated in attaching/detaching the wafer box to/from the vehicle. Further, a cushion may be arranged between the wafer box and the vehicle to effectively prevent the vibrations and the impacts.

Furthermore, the wafer box may be attached/detached to/from the vehicle using the magnetic module, which may include the annular frame, the first permanent magnet, the second permanent magnet and the magnetic switch, to curtail an initial installment cost and replace the mechanical mechanisms using a low cost. The magnetic module may include cheap parts and a simple configuration to curtail a cost and a time in maintenance and repair.

Moreover, the magnetic module may rotate the second permanent magnet to attach/detach the wafer box to/from the vehicle so that a time for attaching/detaching the wafer box to/from the vehicle may be remarkably reduced. As a result, a total transport time of the overhead hoist transport system may also be reduced.

Further, the magnetic energy may not be generated in disorder of the magnetic module. Thus, the wafer box may not be attached to the combiner. As a result, a falling of the wafer box from the combiner may be fundamentally prevented.

Furthermore, the combining member may be combined with the header of the wafer box to attach/detach the wafer box to/from the combiner to reuse the wafer box. Therefore, the overhead hoist transport system according to various embodiments may be compatible with an overhead hoist transport system using the mechanical mechanisms.

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIGS. 3A and 3B are perspective views illustrating a combiner of a vehicle in an overhead hoist transport system in accordance with an embodiment of the present disclosure, wherein FIG. 3A shows a lower portion of the combiner facing a header of a wafer box, and FIG. 3B shows an upper portion of the combiner facing a lifter;

FIGS. 5A and 5B are cross-sectional views illustrating an attachment operation of an overhead hoist transport system in accordance with an embodiment of the present disclosure, wherein FIG. 5A shows a shape of a header and a combiner in the attachment operation, and FIG. 5B is an enlarged cross-sectional view of a portion "A" in FIG. 5A;

FIGS. 6A and 6B are cross-sectional views illustrating a detachment operation of an overhead hoist transport system in accordance with an embodiment of the present disclosure, wherein FIG. 6A shows a shape of a header and a combiner in the detachment operation, and FIG. 6B is an enlarged cross-sectional view of a portion "B" in FIG. 6A;

FIGS. 8A and 8B are perspective views illustrating a combiner of a vehicle in an overhead hoist transport system in accordance with an embodiment of the present disclosure, wherein FIG. 8A shows a lower portion of the combiner facing a header of a semiconductor package magazine, and FIG. 8B shows an upper portion of the combiner facing a lifter.

DETAILED DESCRIPTION

Figure 1:
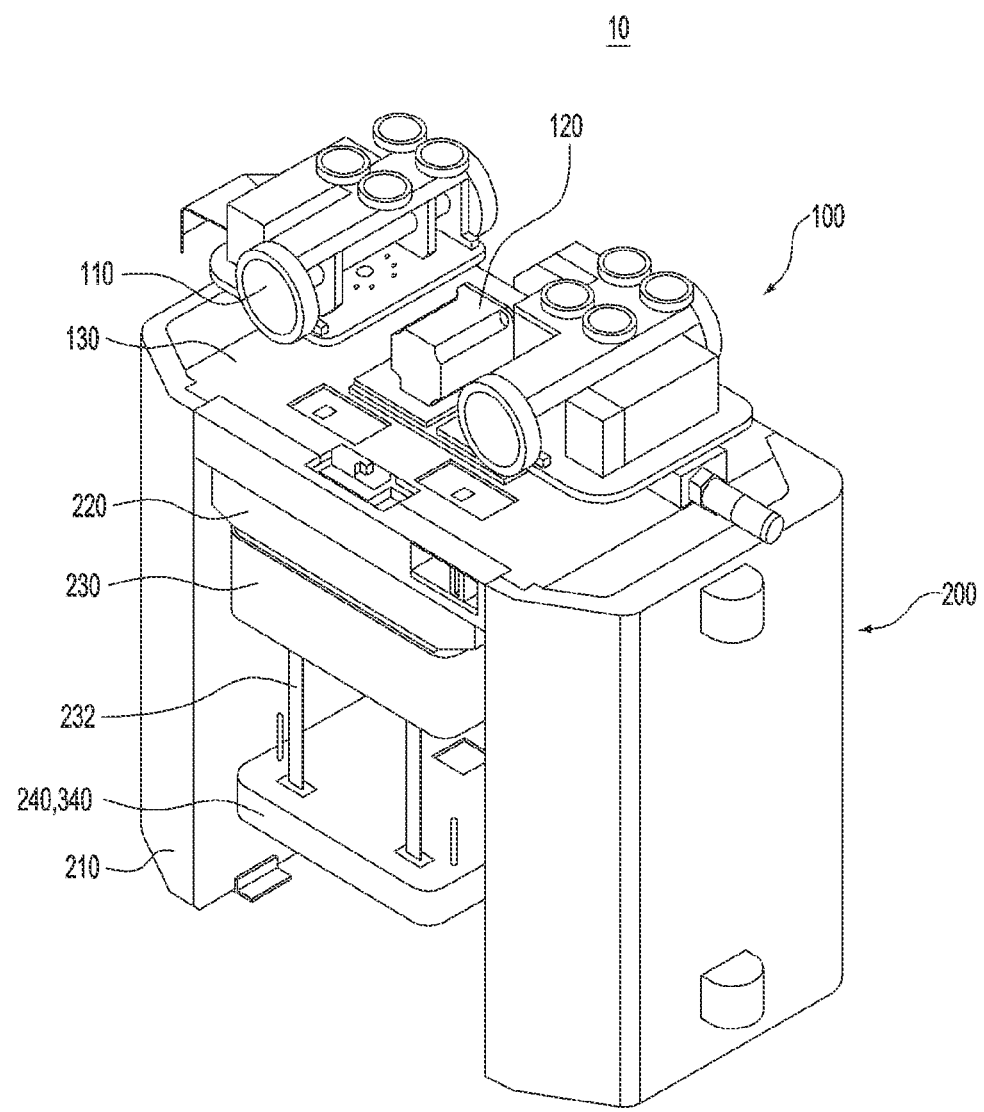
FIG. 1 is a perspective view illustrating a vehicle of an overhead hoist transport system in accordance with an embodiment of the present disclosure.

Various embodiments of the present invention will be described in greater detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of various embodiments of the present invention. However, embodiments of the present invention should not be construed as limiting. Although a few embodiments of the present disclosure will be shown and described, it will be appreciated by those of ordinary skill in the art that changes may be made in these embodiments without departing from the principles and spirit of the present invention.

Various embodiments may provide an overhead hoist transport system capable of solving problems caused by attaching/detaching a wafer box using mechanical mechanisms. The overhead hoist transport system may include a wafer box and a vehicle configured to move the wafer box.

The problems caused by attaching/detaching the wafer box using conventional mechanical mechanisms in a conventional overhead hoist transport system may include vibrations and impacts generated in attaching/detaching the wafer box to/from the vehicle using the mechanical mechanisms. The vibrations and the impacts may be transferred to a wafer in the wafer box causing a decrease in the yield of a semiconductor device. The problems may include a high initial installment cost due to the mechanical mechanisms in a combiner for attaching/detaching the wafer box to/from the vehicle. The problems may include a high maintenance and repair cost due to a periodic repair and replacement caused by a wear and disorder of the mechanical mechanisms. The problems may include a curtailment limit of the physical attachment/detachment due to the physical attachment and detachment operations of the mechanical mechanisms to increase a total transport time. The problems may include a falling of the wafer box because the mechanical mechanisms of the combiner may be operated for a long time which may generate separation, wear, disorder, breakage, etc., of the mechanical mechanisms.

Therefore, various embodiments of the present disclosure may provide an overhead hoist transport system configured to attach/detach the wafer box to/from the vehicle using magnetic energy.

An overhead hoist transport system according to various embodiments of the present disclosure may include a vehicle, a wafer box and a controller. The vehicle may include a combiner. The combiner may include at least one magnetic module. The magnetic module may be fixed to a base plate. The magnetic module may be downwardly protruded. The wafer box may include a header. The header may include a combining member configured to correspond to the magnetic module. The controller may be configured to generate a control signal for controlling the attachment and detachment operations between the combiner and the wafer box. The magnetic module may include a frame, a first permanent magnet, a second permanent magnet and a magnetic switch. The frame may have an annular cross-sectional shape. The first permanent magnet may be fixed to the frame. The second permanent magnet may be rotatably arranged in the frame. The magnetic switch may be configured to rotate the second magnet in response to the control signal.

Figure 2:
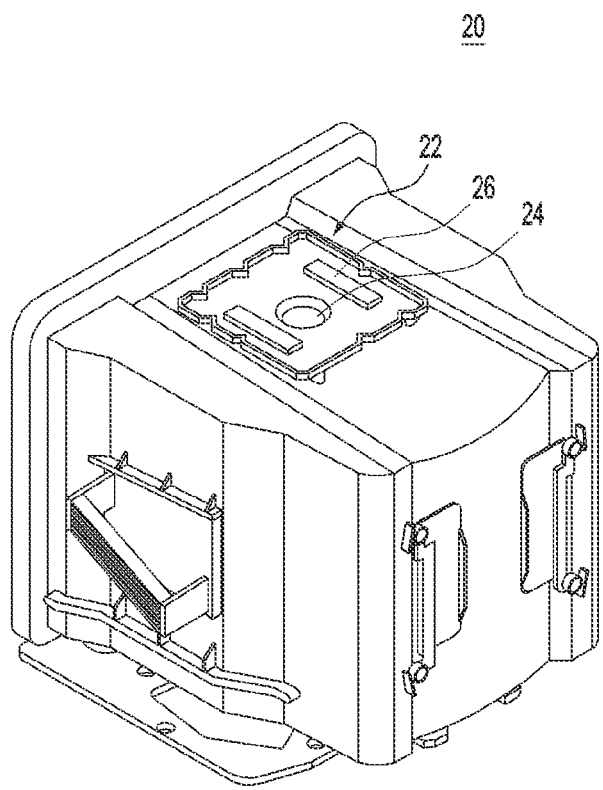
FIG. 2 is a perspective view illustrating a wafer box of an overhead hoist transport system in accordance with an embodiment of the present disclosure.

Hereinafter, the overhead hoist transport system including the wafer box and the vehicle in accordance with various embodiments of the present disclosure may be illustrated in detail, FIG. 1 is a perspective view illustrating a vehicle of an overhead hoist transport system in accordance with an embodiment of the present disclosure, and FIG. 2 is a perspective view illustrating a wafer box of an overhead hoist transport system in accordance with an embodiment of the present disclosure.

Referring to FIGS. 1 and 2, the overhead hoist transport system may include a vehicle 10. The vehicle 10 may move along a rail on a ceiling of a clean room in which semiconductor fabrication apparatuses may be serially arranged to transport a wafer box 20. The vehicle 10 may include a runner 100 and transporter 200.

The runner 100 may include a running roller 110, a driver 120 configured to rotate the running roller 110, and a body 130 configured to combine the transporter 200 with the runner 100. The runner 100 may be moved along the rail by rotating the running roller 110 by the driver 120. The running roller 110 may have a structure suitable for operatively engaging the rail on the ceiling of the clean room. The body 130 may be positioned on a lower surface of the runner 100. For example, the body 130 may include at least one fixing member configured to fix the runner 100 and the transporter 200 to the body 130. The runner 100 may be securely positioned on the body 130. The runner 100 may be securely positioned on an upper surface of the body 130. The transporter 200 may be securely positioned or attached to a lower surface of the body 130.

The wafer box 20 may be attached to the transporter 200. The transporter 200 may be configured to transport the wafer box 20. The transporter 200 may include a housing 210, a horizontal mover 220, a lifter 230 and a combiner 240.

The housing 210 may be combined with the body 130 of the runner 100. The housing 210 may be securely attached with the body 130 of the runner 100, The housing 210 may form an inner space configured to receive the wafer box 20. The housing 210 may have an opened bottom surface and an opened front surface corresponding to one of the side surfaces of the housing 210 through which the wafer box 20 may be moved in vertical and horizontal directions. The front surface of the housing 210 may be a direction substantially perpendicular to a running direction of the vehicle 10. The horizontal mover 220 may be combined with the housing 210 so as to be horizontally moved through the opened front surface of the housing 210. The lifter 230 may be combined with a lower surface of the horizontal mover 220. For example, the lifter 230 may be rotatably combined with a lower surface of the horizontal mover 220, In other words, the lifter 230 is coupled to the center of the horizontal mover 220, and may rotate in a clockwise or counterclockwise direction around the coupling portion of the lifter 230 and the horizontal mover 220. The lifter 230 may be configured to wind a belt 232. The combiner 240 may be fixed to an end of the belt 232, The combiner 240 may be configured to attach/detach the wafer box 20 using magnetic energy. The combiner 240 fixed to the end of the belt 232 may be lifted by the lifter 230.

Although not depicted in FIG. 1, the transporter 200 may include a detector and a controller. The detector may generate an alignment signal for aligning the combiner 240 with a header 22 of the wafer box. The detector may generate a contact signal for contacting the combiner 240 with the header 22. Thus, the detector may include an alignment sensor and a load sensor. The controller may receive the alignment signal from the detector to control the runner 100, the horizontal mover 220 and the lifter 230, thereby adjusting a position of the combiner 240. Further, the controller may receive the contact signal from the detector to generate a control signal for controlling the attachment/detachment between the combiner 240 and the wafer box 20. The control signals generated from the controller may be transmitted to the combiner 240 to control operations of a magnetic module in the combiner 240.

In the overhead hoist transport system according to an embodiment of the present disclosure, the wafer box 20 may include a header 22 arranged at an upper end of the wafer box 20. The header 22 may have a plate shape. The wafer box 20 may be attached/detached to/from the combiner 240 of the runner 10 through the header 22.

The header 22 may include an alignment element 24 and at least one combining member 26. The alignment element 24 may be a hole, a groove, or a cavity formed at a central portion of the header 22, The combining member 26 may be positioned adjacent to the alignment element 24. The combining member 26 may have a shape corresponding to a shape of the magnetic module. The combining member 26 may have a plate shape configured to be attached and fixed to a surface of the header 22. The combining member 26 may have a thickness of about 2 mm to about 10 mm. The combining member 26 may have a surface area lager than a surface area of the magnetic module making contact with the combining member 26. The combining member 26 may include an erosion-resistive material and a wear-resistive material. Further, the combining member 26 may include a reactive material with respect to magnetic energy. For example, the combining member 26 may include a metal or a metal alloy which reacts with the magnetic energy. Particularly, the combining member 26 may include a stainless steel in group of SUS400. The wafer box 20, which may include the header 22 combined with the combining member 26, configured to perform the attachment/detachment operations using the magnetic energy or the mechanical mechanisms may be referred to as a hybrid wafer box.

According to an embodiment, the two combining members 26 having a rectangular plate shape may be arranged at both sides of the alignment element 24 in a row, however other arrangements may be used. The combining member 26 may have various planar shapes and arrangements in accordance with shapes and arrangements of the magnetic module. The combining member 26 may have a shape configured to cover an entire surface of the header 22.

Although not depicted in FIG. 2, the header 22 may further include a cushion configured to cover a surface of the combining member 26 or the entire surface of the header 22 including the combining member 26. The cushion may include a resilient material such as silicon, rubber, etc. In the illustrated embodiment of FIG. 2, two combining members 26 are positioned symmetrically on either side of the alignment element 24.

Figure 3A:
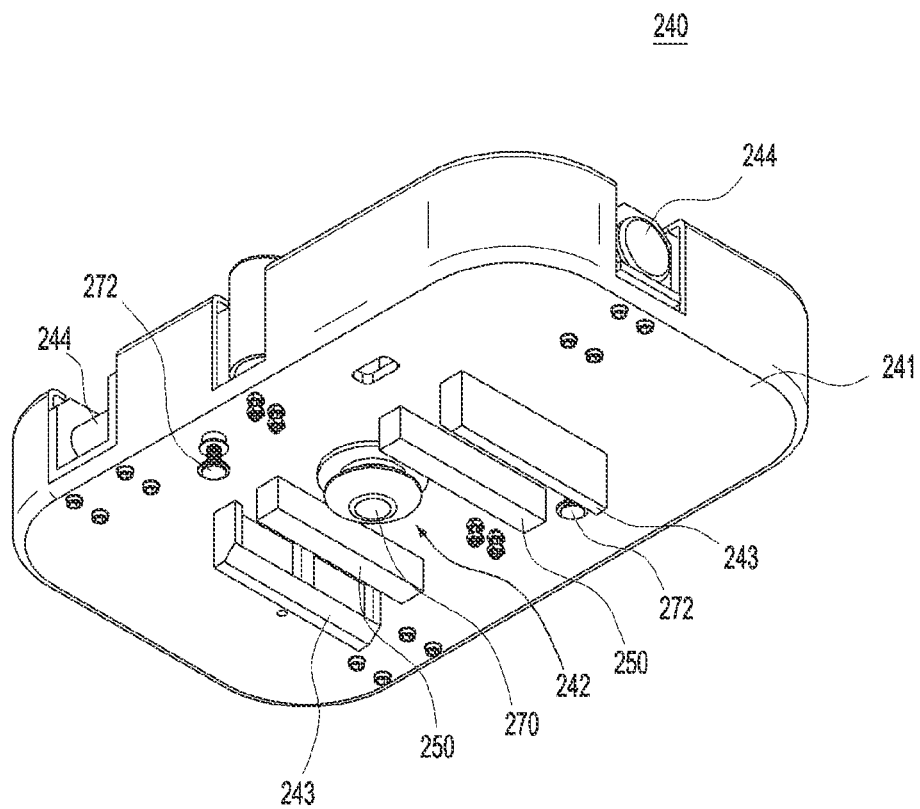
Figure 3B:
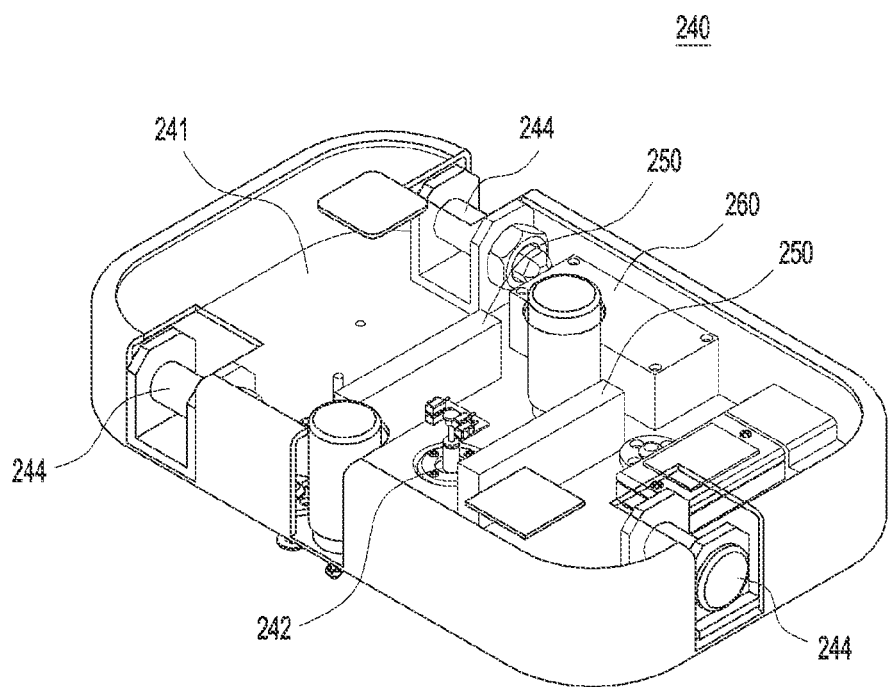
Figure 4:
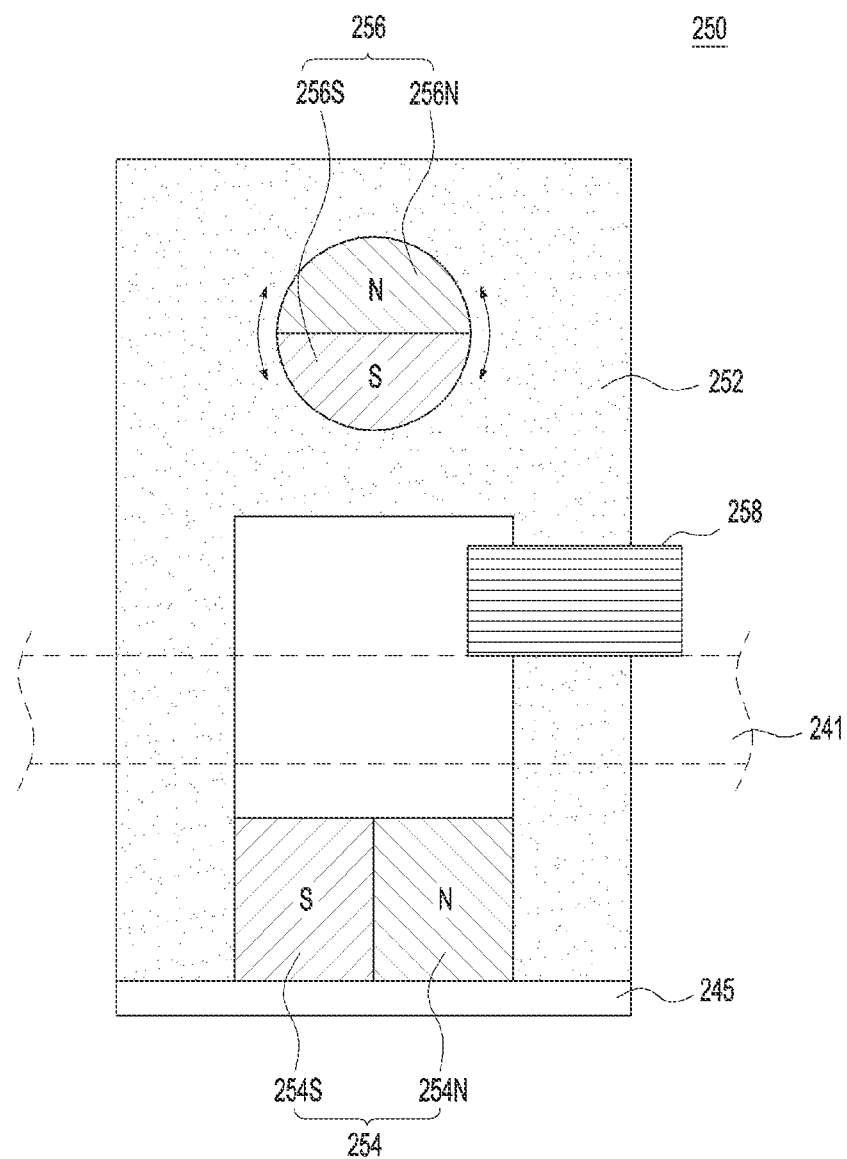
FIG. 4 is a cross-sectional view illustrating a magnetic module in a combiner of a vehicle in accordance with an embodiment of the present disclosure.

FIGS. 3A and 3B are perspective views illustrating a combiner of a vehicle in an overhead hoist transport system in accordance with an embodiment of the present disclosure, wherein FIG. 3A shows a lower portion of the combiner facing a header of a wafer box, and FIG. 3B shows an upper portion of the combiner facing a lifter. FIG. 4 is a cross-sectional view illustrating a magnetic module in a combiner of a vehicle in accordance with an embodiment of the present disclosure.

Referring to FIGS. 2, 3A, 3B and 4, a combiner 240 may include a protruding element 242, a controller 260, a detector 270 and at least one magnetic module 250. The protruding element 242 may be a centering corn. The protruding element 242 may be fixed to a base plate 241, The protruding element 242 may be downwardly protruded from the base plate 242. The protruding element 242 may be shaped as a cylinder, a cone and the like and may be sized and shaped to operatively engage with the alignment element 24. The controller 260 may be configured to control the attachment/detachment between the combiner 240 and the wafer box 20. The detector 270 may be configured to sense an alignment and a contact between the combiner 240 and the wafer box 20. The detector 270 may be placed for example, at a front end of the protruding element 242. Various known sensors can be used as the detector 270. The magnetic module 250 may be configured to attach/detach the wafer box 20 to/from the combiner 240 in response to a control signal. Here, the downward direction of the protruding element 242 may correspond to a direction from the combiner 240 toward the wafer box 20.

The magnetic module 250 may have a bar shape. The magnetic module 250 may have an annular cross-sectional shape. The magnetic module 250 may be positioned at both sides of the protruding element 242 along one direction. The magnetic module 250 may be fixed to the base plate 241. The number and arrangement of the combining member 26 coupled to the header 22 may be determined according to the number and arrangement of the magnetic module 250 coupled to the base plate 241.

The magnetic module 250 may be fixed to the base plate 241, The magnetic module 250 may be partially protruded in the downward direction. That is, a part of the magnetic module 250 may penetrate through the base plate 241 to form a downward protrusion from the base plate 241. The downward protrusion of the magnetic module 250 may function to effectively attach/detach the magnetic module 250 and the header 22. Thus, a height of the downward protrusion of the magnetic module 250 may be lower than a height of the protruding element 242.

The magnetic module 250 may attach/detach the wafer box 20 to/from the combiner 240 using magnetic energy in response to the control signal generated from the controller 260. The magnetic module 250 may include a frame 252, a first permanent magnet 254, a second permanent magnet 256 and a magnetic switch 258. The frame 252 may have an annular shape fixed to the base plate 241. The first permanent magnet 254 may be placed in and fixed to the frame 252. The second permanent magnet 256 may be rotatably arranged in the frame 252. The magnetic switch 258 may be configured to rotate the second permanent magnet 256 in response to the control signal.

The annular frame 252 may provide a path through which the magnetic energy induced by the first permanent magnet 254, the second permanent magnet 256 and the magnetic switch 258 may be transmitted. The annular frame 252 may include a material which reacts with the magnetic energy. For example, the annular frame 252 may comprise metal.

The first permanent magnet 254 may be fixed to a lower end of the frame 252. The first permanent magnet 254 may make contact with the combining member 26 of the header 22 when the attachment operation is performed. Thus, the first permanent magnet 254 may be positioned in the downward protrusion from the base plate 241 to reinforce combination strength between the combiner 240 and the wafer box 20 by the magnetic energy. The first permanent magnet 254 may have a fixed magnetization direction because the first permanent magnet 254 may be fixed to the frame 252. A maximum weight of the wafer box 20 transported by the transporter 200 may be increased in proportion to an increase of a magnetic force provided from the first permanent magnet 254. The first permanent magnet 254 may have a bar shape. The first permanent magnet 254 may include a first N pole 254N and a first S pole 254S, The magnetization direction of the first permanent magnet 254 may be parallel to the surface of the header 22.

The second permanent magnet 256 may be rotatably arranged in the frame 252 and may have a magnetization direction similarly to the first permanent magnet 254. However, the magnetization direction of the second permanent magnet 256 may be changed by rotating the second permanent magnet 256. The second permanent magnet 256 may face the first permanent magnet 254. Thus, the wafer box 20 may be attached/detached to/from the combiner 240 in accordance with the magnetization directions of the first permanent magnet 254 and the second permanent magnet 256. The second permanent magnet 256 may have a cylindrical shape readily rotated in the frame 252. An extending direction of the bar-shaped first permanent magnet 254 may be substantially the same as an extending direction of the cylindrical second permanent magnet 256. The second permanent magnet 256 may include a semi-spherical second N pole 256N and a semi-spherical second S pole 256S. The magnetization direction of the second permanent magnet 256 may be parallel to the magnetization direction of the first permanent magnet 254.

When the wafer box 20 is attached to the combiner 240, the second permanent magnet 256 may be rotated using the magnetic switch 258 to provide the second permanent magnet 256 with a magnetization direction which is substantially the same as the magnetization direction of the first permanent magnet 254. In contrast, when the wafer box 20 is detached from the combiner 240, the second permanent magnet 256 may be rotated using the magnetic switch 258 to provide the second permanent magnet 256 with a magnetization direction which is substantially opposite to the magnetization direction of the first permanent magnet 254.

The magnetic switch 258 may rotate the second permanent magnet 256 in response to the control signal generated from the controller 260 to provide the second permanent magnet 256 with the magnetization direction substantially equal to or opposite to the magnetization direction of the first permanent magnet 254. The magnetic switch 258 may include a coil wound on the frame 252 between the first permanent magnet 254 and the second permanent magnet 256, Particularly, the magnetic switch 258 may be installed at one side of the frame 252 between the first permanent magnet 254 and the second permanent magnet 256. The magnetic switch 258 may be positioned adjacent to the first N pole 254N of the first permanent magnet 254, Thus, the control signal applied to the magnetic switch 258 may be a direct current power. That is, the direct current power may be applied to the magnetic switch 258 for about 0.1 second to about 1 second in the attachment/detachment operations. Particularly, when the wafer box 20 is attached to the combiner 240, a forward-directional direct current may be applied to the magnetic switch 258. In contrast, when the wafer box 20 is detached from the combiner 240, a reverse-directional direct current may be applied to the magnetic switch 258. The direct current power may have a voltage value of about 10V to about 30V and a current value of about 1 A to about 2 A.

According to an embodiment of the present disclosure, the two magnetic modules 250 may be arranged at the both sides of the protruding element 242, not restricted within the above-mentioned arrangement. For example, one magnetic module 250 may be arranged adjacent to one end of the protruding element 242. Alternatively, at least three magnetic modules 250 may be arranged to surround the protruding element 242.

Further, part of the magnetic module 250 may penetrate through the base plate 241 to have the downward protrusion from the base plate 241, however, other configurations may be used. For example, the magnetic module 250 may be fixed to a lower surface or an upper surface of the base plate 241. When the magnetic module 250 is fixed to the upper surface of the base plate 241, the base plate 241 may make contact with the header 22 in the attachment operation. The base plate 241 may include a material which reacts with the magnetic energy. For example, the base plate 241 may comprise metal.

The protruding element 242 of the combiner 240 may function to prevent a misalignment between the combiner 240 and the header 22. When the wafer box 20 is attached to the combiner 240, the protruding element 242 may be partially inserted into the alignment element 24 of the header 22.

The detector 270 may generate the alignment signal for aligning the combiner 240 and the header 22 of the wafer box 20, and the contact signal for determining whether or not the wafer box 20 may make contact with the combiner 240. The detector 270 may include an alignment sensor for generating the alignment signal and a load sensor 272 for generating the contact signal. The alignment sensor may sense a position and a shape of the header 22 to generate the alignment signal. The alignment sensor may include an optical sensor arranged in the protruding element 242. The load sensor 272 may be arranged in the protruding element 242. When the protruding element 242 is partially inserted into the alignment element 24 of the header 22, the load sensor 272 may generate the contact signal. Further, the load sensor 272 may be fixed to the base plate 241, The load sensor 272 may be downwardly protruded from the base plate 241. The load sensor 272 may be positioned adjacent to the magnetic module 250.

The controller 260 may receive the alignment signal from the detector 270 to control a position of the combiner 240. Further, the controller 260 may receive the contact signal from the detector 270 to generate the control signal for attaching/detaching the wafer box 20, thereby controlling the attachment/detachment of the combiner 240.

The combiner 240 may include a plurality of guide pins 243, a plurality of belt clampers 244 and a cushion 245, The guide pins 243 may be fixed to the base plate 241. The guide pins 243 may be downwardly protruded from the base plate 241. The belt clamper 244 may be fixed to the base plate 241, The belt clamper 244 may fix an end of the belt 242 extended from the lifter 230. The cushion 245 may be arranged on a surface of the magnetic module 250 downwardly protruded from the base plate 241. The guide pins 243 may align the combiner 240 with the header 22 together with the detector 270. The guide pins 243 may have a bar shape. The guide pins 243 may have a sidewall aligned with a sidewall of the header 22. Further, the sidewall of the guide pins 243 aligned with the sidewall of the header 22 may have a profile corresponding to a profile of the sidewall of the header 22. The cushion 245 may prevent generation of vibrations and impacts at the wafer box 20 in the attachment/detachment operations. The cushion 245 may have a thickness which has no substantial influence on the combination strength between the header 22 and the combiner 240 by the magnetic energy. The cushion may include, for example, silicon, rubber, etc.

According to an embodiment of the present disclosure, the controller 260 may be fixed to the base plate 241 of the combiner 240, Alternatively, the controller 260 may be located at one of the housing 210, the horizontal mover 220 and the lifter 230 of the transporter 200.

Figure 5A:
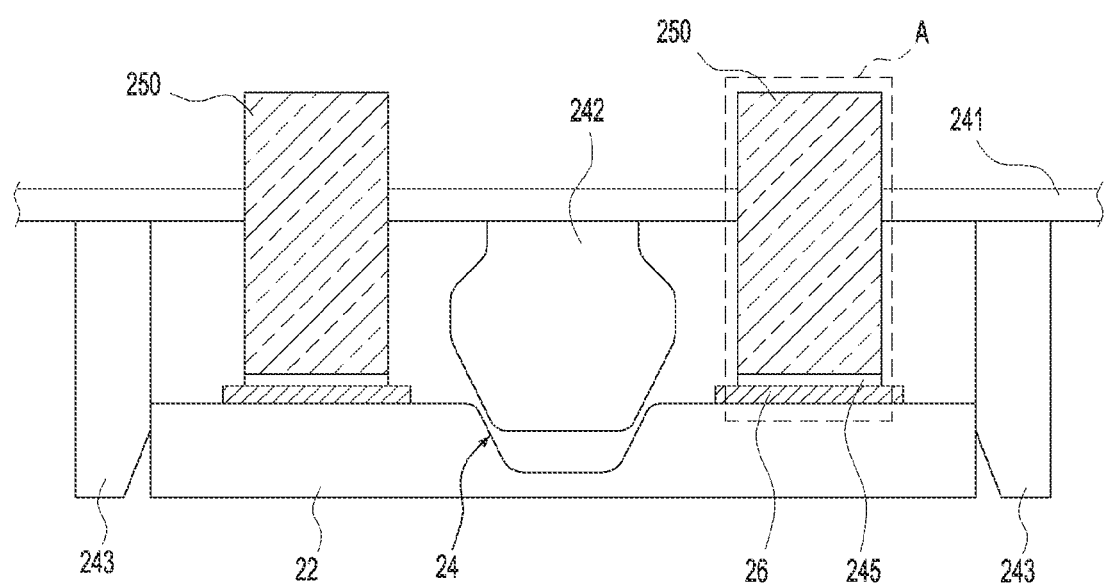
Figure 5B:
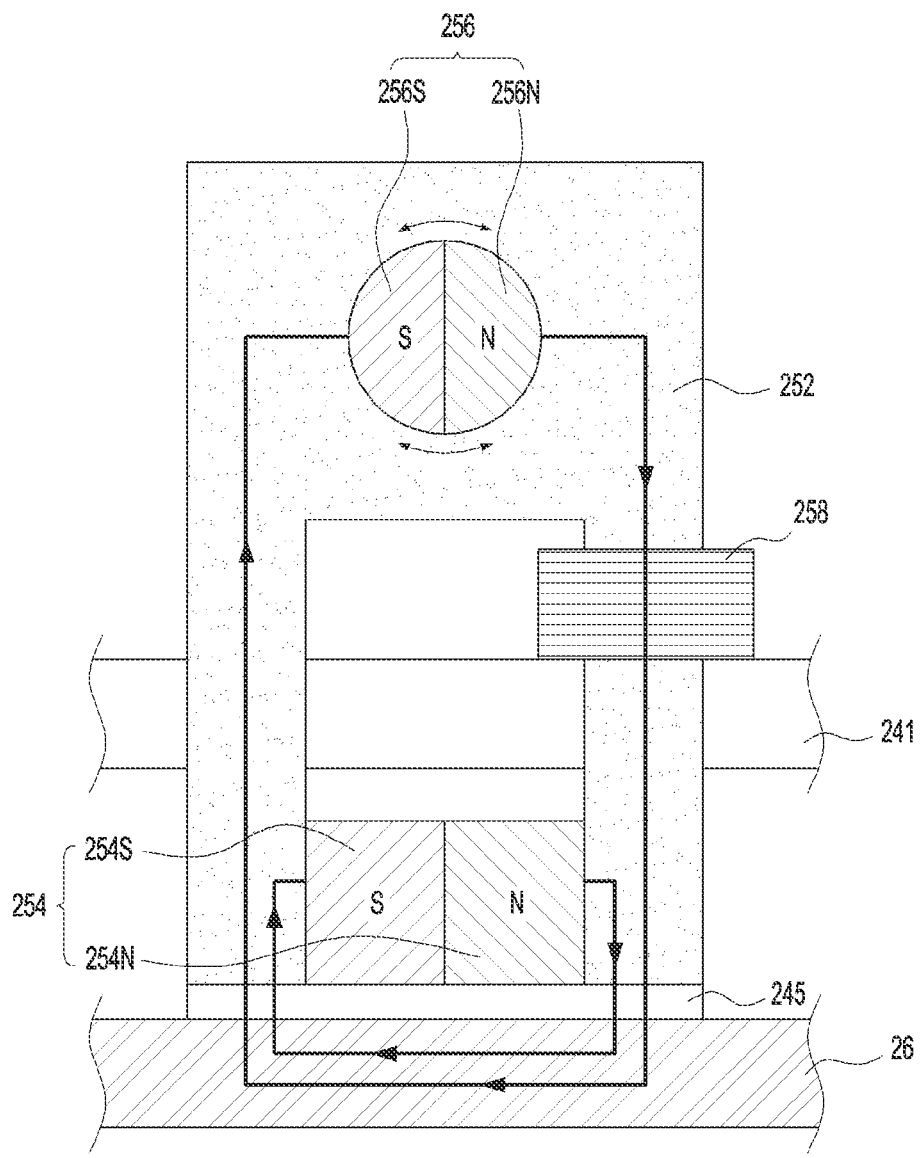

FIGS. 5A and 5B are cross-sectional views illustrating an attachment operation of an overhead hoist transport system in accordance with an embodiment of the present disclosure, wherein FIG. 5A shows a shape of a header and a combiner in the attachment operation, and FIG. 5B is an enlarged cross-sectional view of a portion "A" in FIG. 5A.

Referring to FIGS. 5A and 5B, when the protruding element 242 of the combiner 240 is partially inserted into the alignment element 24, the magnetic module 250 may make contact with the combining member 26 of the header 22. The contact signal generated from the detector 270 by partially inserting the protruding element 242 into the alignment element 24 may be transmitted to the controller 260. The controller 260 may generate the control signal in response to the contact signal. The control signal of the controller 260, for example, the forward direct current having a short pulse of no more than about 1 second may be applied to the magnetic switch 258 of the magnetic module 250. The second permanent magnet 256 may be rotated by the magnetic force induced by the magnetic switch 258 in response to the control signal to provide the second permanent magnet 256 with the magnetization direction which is substantially the same as the magnetization direction of the first permanent magnet 254. By aligning the first permanent magnet 254 and the second permanent magnet 256 having the same magnetization direction, which may be vertically arranged and parallel to each other, the magnetic energy generated from the magnetic module 250 may be transferred to the combining member 26 to attach the combining member 26 to the magnetic module 250. The magnetization direction of the second permanent magnet 256 rotated by the magnetic switch 258 may be maintained without an external force, That is, the attachment between the combining member 26 and the magnetic module 250 may be maintained without additional power consumption until the control signal for the detachment may be applied. Therefore, the wafer box 20 may be attached to the combiner 240 only by rotating the second permanent magnet 256 of the magnetic module 250.

Figure 6A:
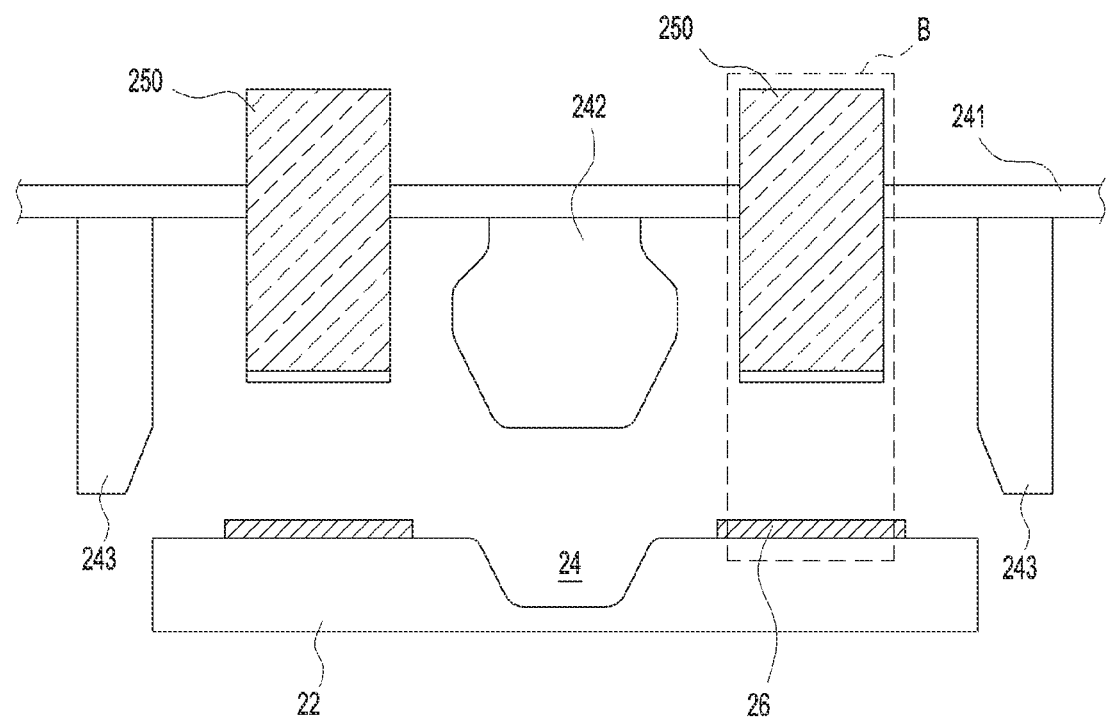
Figure 6B:
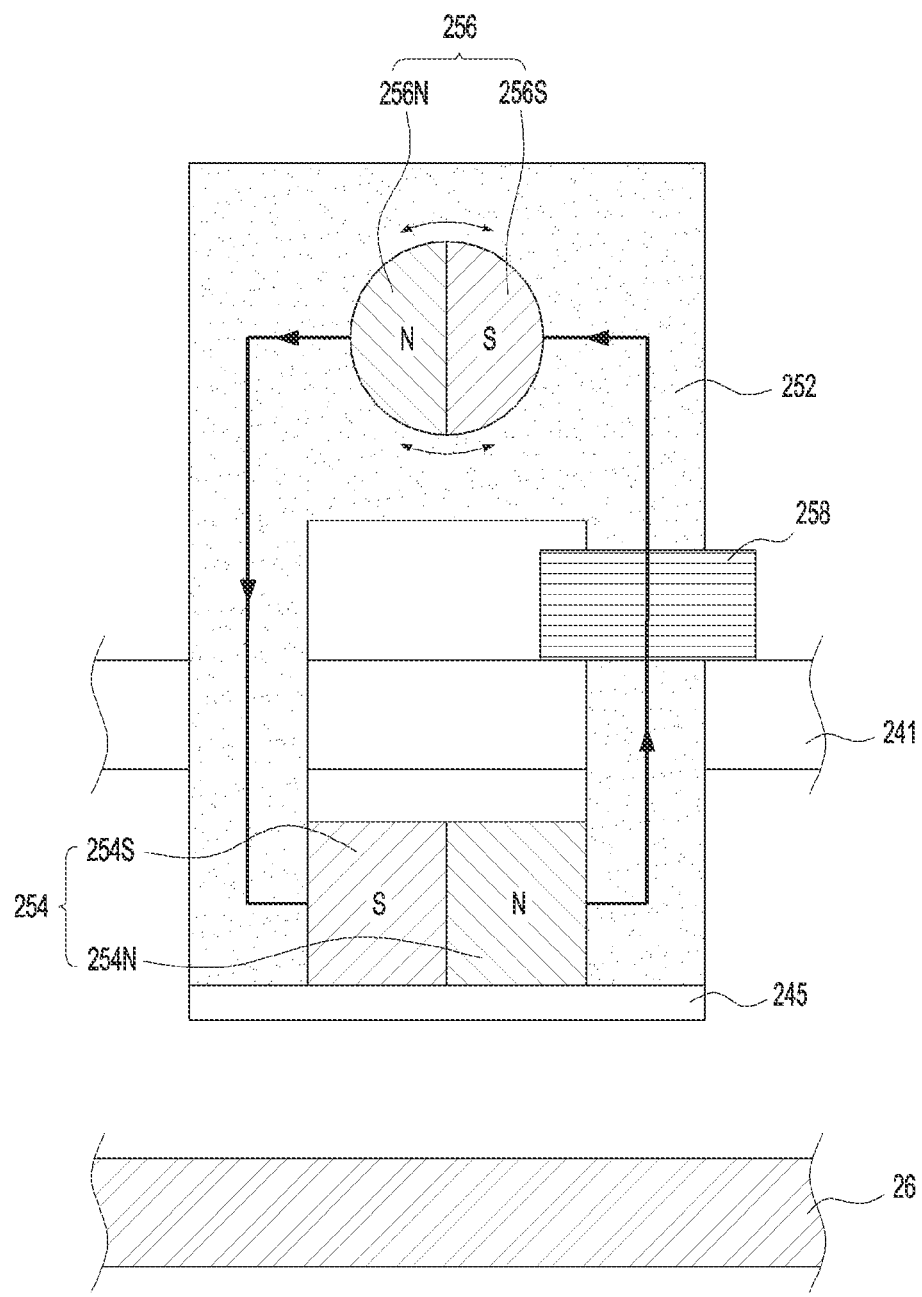

FIGS. 6A and 6B are cross-sectional views illustrating a detachment operation of an overhead hoist transport system in accordance with an embodiment of the present disclosure, wherein FIG. 6A shows a shape of a header and a combiner in the detachment operation, and FIG. 6B is an enlarged cross-sectional view of a portion "B" in FIG. 6A.

Referring to FIGS. 6A and 6B, when the header 22 attached to the combiner 240 by the magnetic energy of the magnetic module 250 is detached from the combiner 240, the control signal of the controller 260, for example, the reverse direct current having a short pulse of no more than about 1 second may be applied to the magnetic switch 258 of the magnetic module 250. The second permanent magnet 256 may be rotated by the magnetic force induced by the magnetic switch 258 in response to the control signal to provide the second permanent magnet 256 with the magnetization direction opposite to the magnetization direction of the first permanent magnet 254. By aligning the first permanent magnet 254 and the second permanent magnet 256 having opposite magnetization directions, which may be vertically arranged and parallel to each other, the wafer box 20 may be detached from the combiner 240. The magnetic energy generated from the magnetic module 250 may form a closed loop along the annular frame 252 so that the magnetic energy applied to the combining member 26 may be blocked to detach the wafer box 20 from the combiner 240. The magnetization direction of the second permanent magnet 256 rotated by the magnetic switch 258 may be maintained without an external force. Therefore, the wafer box 20 may be detached from the combiner 240 only by rotating the second permanent magnet 256 of the magnetic module 250.

Figure 7:
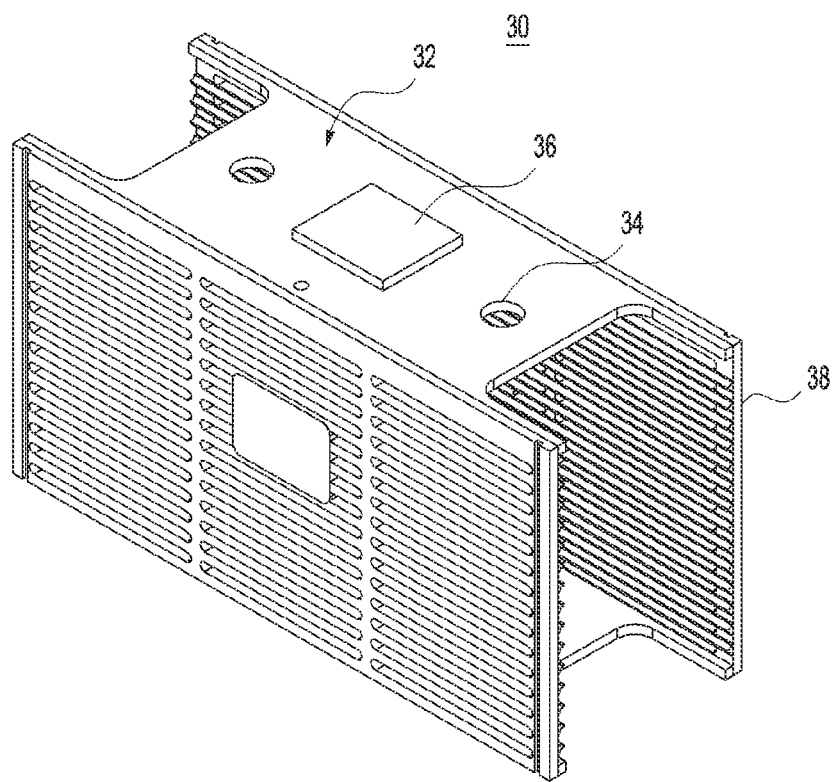
FIG. 7 is a perspective view illustrating a semiconductor package magazine of an overhead hoist transport system in accordance with an embodiment of the present disclosure.

FIG. 7 is a perspective view illustrating a semiconductor package magazine of an overhead hoist transport system in accordance with an embodiment of the present disclosure.

Referring to FIGS. 1 and 7, the overhead hoist transport system may include a semiconductor package magazine 30. The semiconductor package magazine 30 may include a body part 38 in which a plurality of PCBs are accommodated, and a header part 32 positioned at an upper end of the body part 38. The semiconductor package magazine 30 may be detachably attached to the combiner 340 of the vehicle 10 through the header part 32. For reference, the one or more magnetic modules 250 provided in the combiner 340 may be the same as those described with reference to FIGS. 4, 5B, and 6B.

The header part 32 may include at least one combining member 36 positioned at the center to correspond to the magnetic module 250 and alignment holes 34 formed on both sides of the combining member 36. The combining member 36 may have a plate shape configured to be attached and fixed to a surface of the header part 32. The combining member 36 may have a thickness of about 2 mm to about 10 mm. The combining member 36 may have a surface area lager than a surface area of the magnetic module 250 making contact with the combining member 36. The combining member 36 may include an erosion-resistive material and a wear-resistive material. Further, the combining member 36 may include a reactive material with respect to magnetic energy. For example, the combining member 36 may include a metal or a metal alloy which reacts with the magnetic energy. Particularly, the combining member 36 may include a stainless steel in group of SUS400.

Although not depicted in FIG. 7, the header part 32 may further include a cushion configured to cover a surface of the combining member 36 or the entire surface of the header part 32 including the combining member 36. The cushion may include a resilient material such as silicon, rubber, etc.

Figure 8A:
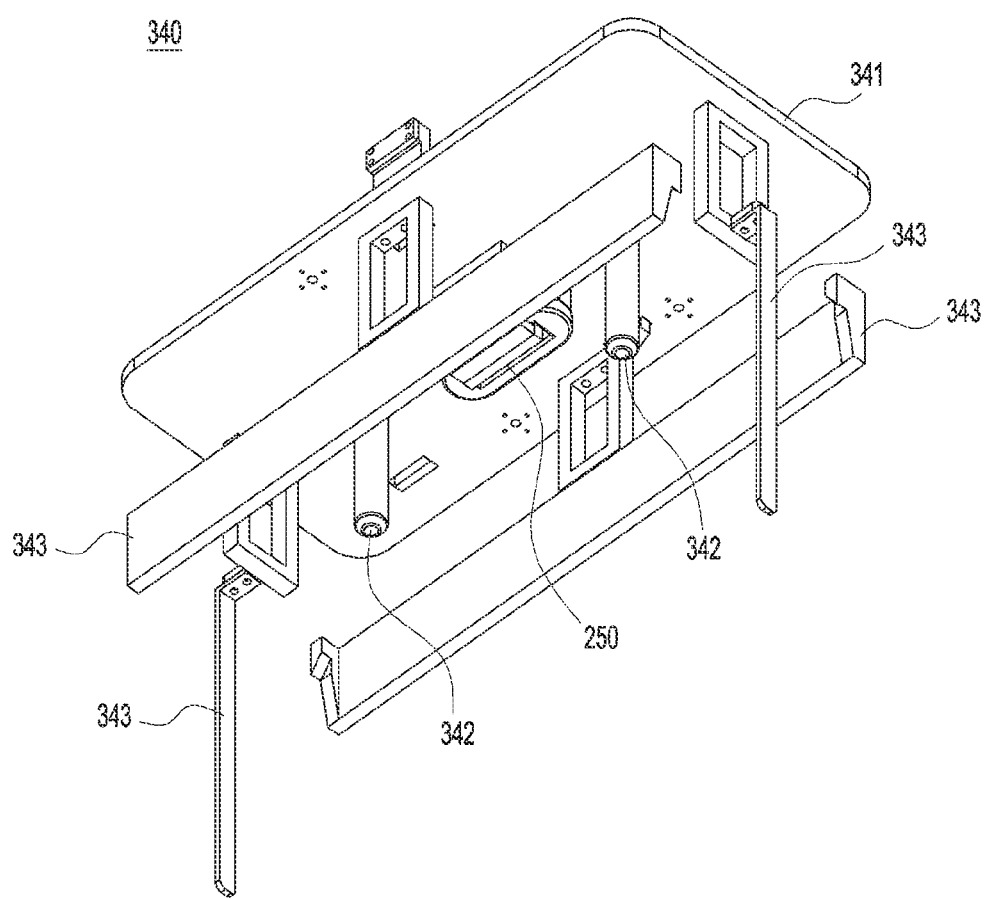
Figure 8B:
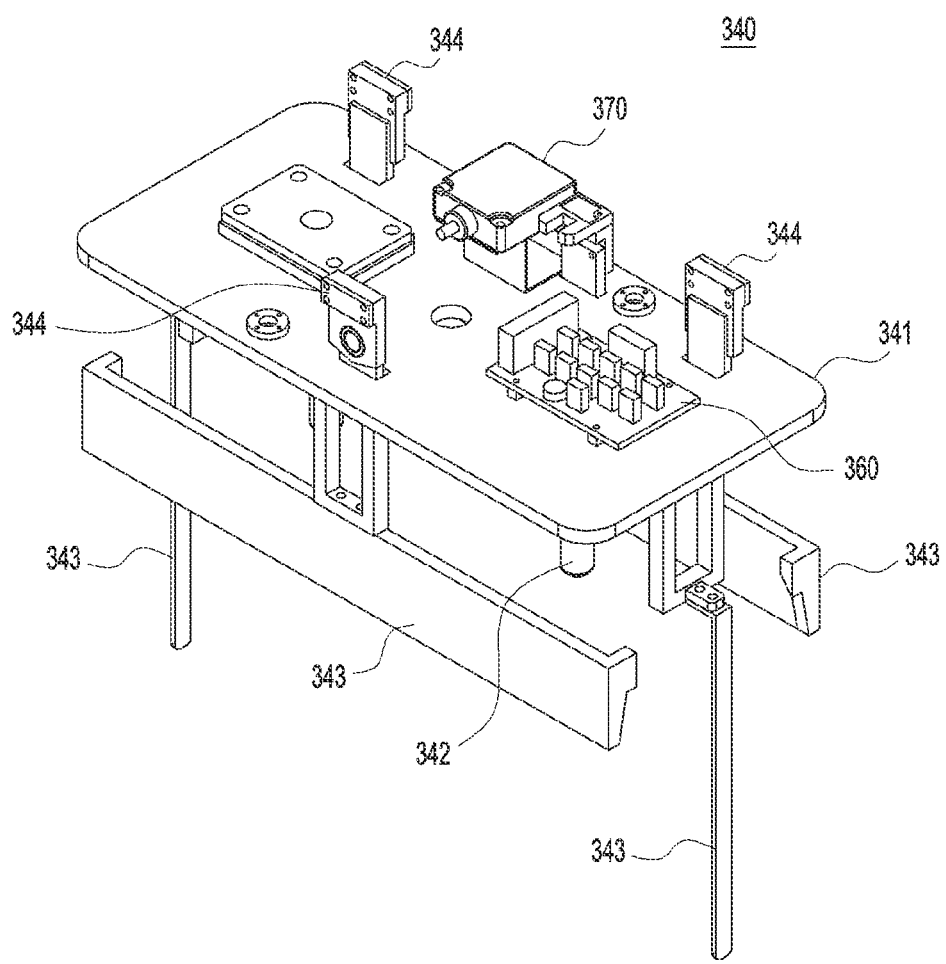

FIGS. 8A and 8B are perspective views illustrating a combiner of a vehicle in an overhead hoist transport system in accordance with an embodiment of the present disclosure, wherein FIG. 8A shows a lower portion of the combiner facing a header of a semiconductor package magazine, and FIG. 8B shows an upper portion of the combiner facing a lifter.

Referring to FIGS. 7, 8A, and 8B, a combiner 340 may include an alignment column 342, a controller 360, a detector 370 and at least one magnetic module 250. The alignment column 342 may be fixed to a base plate 341. The alignment column 342 may be downwardly protruded from the base plate 342. The alignment column 342 may be shaped as a cylinder, a cone and the like and may be sized and shaped to operatively engage with the alignment hole 34. The controller 360 may be configured to control the attachment/detachment between the combiner 340 and the semiconductor package magazine 30. The detector 370 may be configured to sense an alignment and a contact between the combiner 340 and the semiconductor package magazine 30. The detector 370 may be placed for example, at a front end of the alignment column 342. Various known sensors can be used as the detector 370. The magnetic module 250 may be configured to attach/detach the semiconductor package magazine 30 to/from the combiner 340 in response to a control signal. Here, the downward direction of the alignment column 342 may correspond to a direction from the combiner 340 toward the semiconductor package magazine 30.

The magnetic module 250 may have a bar shape, and may its have an annular cross-sectional shape (See FIG. 4). The magnetic module 250 may be fixed to the base plate 341. The number and arrangement of the combining member 36 coupled to the header part 32 may be determined according to the number and arrangement of the magnetic module 250 coupled to the base plate 341. Here, a detailed description of the magnetic module 250 will be omitted.

The alignment column 342 of the combiner 340 may function to prevent a misalignment between the combiner 340 and the header part 32. When the semiconductor package magazine 30 is attached to the combiner 340, the alignment column 342 may be partially inserted into the alignment hole 34 of the header part 32.

The detector 370 may generate the alignment signal for aligning the combiner 340 and the header part 32 of the semiconductor package magazine 30, and the contact signal for determining whether or not the semiconductor package magazine 30 may make contact with the combiner 340. The detector 370 may include an alignment sensor for generating the alignment signal and a load sensor for generating the contact signal. The alignment sensor may sense a position and a shape of the header part 32 to generate the alignment signal. The alignment sensor may include an optical sensor arranged in the alignment column 342. The load sensor may be arranged in the alignment column 342. When the alignment column 342 is partially inserted into the alignment hole 34 of the header part 32, the load sensor may generate the contact signal. Further, the load sensor may be fixed to the base plate 341. The load sensor may be downwardly protruded from the base plate 341. The load sensor may be positioned adjacent to the magnetic module 250.

The controller 360 may receive the alignment signal from the detector 370 to control a position of the combiner 340. Further, the controller 360 may receive the contact signal from the detector 370 to generate the control signal for attaching/detaching the semiconductor package magazine 30, thereby controlling the attachment/detachment of the combiner 340.

The combiner 340 may include a plurality of guide pins 343, a plurality of belt clampers 344 and a cushion (not shown). The guide pins 343 may be fixed to the base plate 341. The guide pins 343 may be downwardly protruded from the base plate 341. The belt clamper 344 may be fixed to the base plate 341, The belt clamper 344 may fix an end of the belt 242 extended from the lifter 230 (See FIG. 1). The cushion may be arranged on a surface of the magnetic module 250 downwardly protruded from the base plate 341, The guide pins 343 may align the combiner 340 with the header part 32 together with the detector 370. The guide pins 343 may server to prevent the PCBs accommodated in the semiconductor package magazine 30 from being detached during movement. The guide pins 343 may have a bar shape. The guide pins 343 may have a sidewall aligned with a sidewall of the body part 38.

According to various embodiments, the wafer box 20 may be attached/detached to/from the vehicle using the magnetic energy without mechanical mechanisms to prevent vibrations and impacts from being generated in attaching/detaching the wafer box 20 to/from the vehicle. Further, a cushion 245 may be arranged between the wafer box 20 and the combiner 240 to effectively prevent the vibrations and the impacts between the wafer box and the combiner 240.

Furthermore, the wafer box 20 may be attached/detached to/from the vehicle using the magnetic module 250, which may include the annular frame 252, the first permanent magnet 254, the second permanent magnet 256 and the magnetic switch 258, to curtail an initial installment cost and replace the mechanical mechanisms using a low cost. The magnetic module may include inexpensive parts and a simple configuration to curtail costs and time in maintenance and repair.

Moreover, the magnetic module 250 may rotate the second permanent magnet 256 to attach/detach the wafer box 20 to/from the vehicle so that a time for attaching/detaching the wafer box 20 to/from the vehicle may be remarkably reduced. As a result, a total transport time of the overhead hoist transport system may also be reduced.

Further, the magnetic energy may not be generated in disorder of the magnetic module 250. Thus, the wafer box 20 may not be attached to the combiner 240. As a result, a falling of the wafer box 20 from the combiner may 240 be fundamentally prevented.

Furthermore, the combining member 26 may be combined with the header 22 of the wafer box 20 to attached/detach the wafer box 20 to/from the combiner 240 to reuse the wafer box 20. Therefore, the overhead hoist transport system according to various embodiments of the present disclosure may be compatible with an overhead hoist transport system using the mechanical mechanisms.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications which are obvious in view of the present disclosure, are intended to fall within the scope of the appended claims.

What is claimed is:

1. An overhead hoist transport system comprising:
   a vehicle including a combiner, the combiner including at least one magnetic module fixed to a base plate, the magnetic module downwardly protruded from the base plate;
   a wafer box including a header, the header including a combining member configured to correspond to the magnetic module;
   a controller configured to control a control signal for controlling attachment/detachment between the combiner and the wafer box; and
   a cushion arranged between the magnet module and the combining member.

2. The overhead hoist transport system of claim 1, wherein the vehicle further comprises a detector which senses an alignment and a contact between the combiner and the header to generate an alignment signal and a contact signal, wherein the detector transmits the alignment signal and the contact signal to the controller.

3. The overhead hoist transport system of claim 2, wherein the controller receives the alignment signal to control a position of the combiner, and wherein the controller receives the contact signal to generate the control signal for controlling operations of the magnetic module.

4. The overhead hoist transport system of claim 2, wherein the combiner further comprises a protruding element fixed to the base plate and downwardly protruded from the base plate, and wherein the header further comprises an alignment element configured to operatively engage with the protruding element.

5. The overhead hoist transport system of claim 4, wherein the detector is positioned in the protruding element to generate the alignment signal when the protruding element is partially inserted into the alignment element.

6. The overhead hoist transport system of claim 4, wherein the magnetic module is positioned adjacent to the protruding element, one magnetic module is arranged at one side of the protruding element, two magnetic modules are arranged at both sides of the protruding element, or at least three magnetic modules surround the protruding element.

7. The overhead hoist transport system of claim 1, wherein the combiner further comprises a plurality of guide pins fixed to the base plate and downwardly protruded from the base plate, and wherein the guide pins are arranged on an edge portion of both sidewalls of the header.

8. The overhead hoist transport system of claim 1,
   wherein the cushion is arranged on a contact surface of the magnetic module and a contact surface of the combining member, or arranged on one of the contact surfaces of the magnetic module and the combining member.

9. The overhead hoist transport system of claim 1, wherein the combining member comprises a metal plate configured to cover an entire surface of the header or having a plate shape corresponding to the magnetic module.

10. The overhead hoist transport system of claim 1, wherein the magnetic module includes a frame having an annular cross-sectional shape, a first permanent magnet fixed to the frame, a second permanent magnet rotatably arranged in the frame, and a magnetic switch configured to rotate the second magnet in response to the control signal, wherein the second permanent magnet is rotated to provide the second permanent magnet with a magnetization direction substantially the same as a magnetization direction of the first permanent magnet when the wafer box is attached to the combiner, and
   wherein the second permanent magnet is rotated to provide the second permanent magnet with a magnetization direction opposite to the magnetization direction of the first permanent magnet when the wafer box is detached from the combiner.

11. The overhead hoist transport system of claim 1, wherein a part of the magnetic module penetrates the base plate to be downwardly protruded from the base plate or a total magnetic module is fixed to a lower surface of the base plate.

12. The overhead hoist transport system of claim 10, wherein the first permanent magnet is located under the base plate, the second permanent magnet is located over the base plate, and the first permanent magnet and the second permanent magnet face each other in a frame.

13. The overhead hoist transport system of claim 10, wherein the first permanent magnet has a bar shape, and wherein the first permanent magnet has a magnetization direction parallel to a surface of the combining member.

14. The overhead hoist transport system of claim 10, wherein the second permanent magnet has a cylindrical shape, and wherein the second permanent magnet has a magnetization direction parallel to a magnetization direction of the first permanent magnet.

15. The overhead hoist transport system of claim 10, wherein the magnetic switch comprises a coil wound on one side of a frame between the first permanent magnet and the second permanent magnet.

16. The overhead hoist transport system of claim 15, wherein the control signal comprises a direct current power, wherein the direct current power is applied to the magnetic switch for 0.1 to 1 seconds in an attachment/detachment operation.

17. The overhead hoist transport system of claim 16, wherein a forward direct current power is applied to the magnetic switch when the wafer box is attached to the combiner, and
   wherein a reverse direct current power is applied to the magnetic switch when the wafer box is detached from the combiner.

18. The overhead hoist transport system of claim 16, wherein the direct current power has a voltage value of 10V to 30V and a current value of 1 A to 2 A.

19. The overhead hoist transport system of claim 1, wherein the vehicle comprises a runner which moves along a rail, and a transporter combined with the runner, and the wafer box is attached/detached to/from the transporter,
   wherein the transporter comprises a housing combined with the runner and having an inner space configured to receive the wafer box, a horizontal mover movably combined with the housing in a horizontal direction, and a lifter rotatably combined with the horizontal mover to wind a belt, and
   wherein the combiner is combined with an end of the belt extended from the lifter.

20. The overhead hoist transport system of claim 19, wherein the housing has an opened lower surface and an opened side surface, and wherein the horizontal mover is horizontally moved outside the housing through the opened side surface of the housing.

* * * * *